(12) United States Patent
Geh

(10) Patent No.: US 8,212,988 B2
(45) Date of Patent: Jul. 3, 2012

(54) PROJECTION OBJECTIVE FOR MICROLITHOGRAPHY

(75) Inventor: Bernd Geh, Scottsdale, AZ (US)

(73) Assignee: Carl Zeiss GmbH, Oberkochen (DE)

( * ) Notice: Subject to any disclaimer, the term of this patent is extended or adjusted under 35 U.S.C. 154(b) by 942 days.

(21) Appl. No.: 11/658,574

(22) PCT Filed: Aug. 3, 2005

(86) PCT No.: PCT/EP2005/008392
§ 371 (c)(1), (2), (4) Date: Jan. 3, 2008

(87) PCT Pub. No.: WO2006/013100
PCT Pub. Date: Feb. 9, 2006

(65) Prior Publication Data
US 2008/0252987 A1    Oct. 16, 2008

Related U.S. Application Data

(60) Provisional application No. 60/599,055, filed on Aug. 6, 2004.

(51) Int. Cl.
*G03B 27/42* (2006.01)
(52) U.S. Cl. .................. 355/53; 355/55; 355/67
(58) Field of Classification Search .............. 355/30, 355/53, 55, 67, 72, 76
See application file for complete search history.

(56) References Cited

U.S. PATENT DOCUMENTS

| | | |
|---|---|---|
| 4,812,028 A | 3/1989 | Matsumoto |
| 5,052,763 A | 10/1991 | Singh et al. |
| 5,527,139 A | 6/1996 | Bruder et al. |
| 6,014,421 A | 1/2000 | Chiba et al. |
| 6,461,908 B2 | 10/2002 | Stolk et al. |
| 2002/0167651 A1 | 11/2002 | Boonman et al. |
| 2003/0090640 A1 | 5/2003 | Fujisawa et al. |
| 2003/0133087 A1* | 7/2003 | Shima .............................. 355/53 |
| 2004/0046950 A1* | 3/2004 | Sasaya et al. ................... 355/55 |

FOREIGN PATENT DOCUMENTS

| | | |
|---|---|---|
| EP | 1 231 513 A1 | 8/2002 |
| JP | 06036987 | 2/1994 |
| JP | 2003133223 A | 5/2003 |
| JP | 2003142373 A | 5/2003 |
| JP | 2003178971 A | 6/2003 |
| JP | 2003203848 A | 7/2003 |
| JP | 2003264136 A | 9/2003 |

OTHER PUBLICATIONS

Erhard Glatzel, "New Lenses for Microlithography", SPIE vol. 237, 1980 International Lens Design Conference (OSA), pp. 310-320.
Fischer, R. et al., "Optical System Design", 2000, pp. 61-95, McGraw-Hill, United States of America.

* cited by examiner

*Primary Examiner* — Edward Glick
*Assistant Examiner* — Mesfin T Asfaw
(74) *Attorney, Agent, or Firm* — Sughrue Mion, PLLC

(57) ABSTRACT

A projection objective for imaging a pattern arranged in an object surface of the projection objective into an image surface of the projection objective with a demagnified imaging scale has a plurality of optical elements which are arranged along an optical axis of the projection objective and are configured in such a way that a defined image field curvature of the projection objective is set in such a way that an object surface that is curved convexly with respect to the projection objective can be imaged into a planar image surface. What can be achieved given a suitable setting of the object surface curvature is that a gravitation-dictated bending of a mask does not have a disturbing effect on the imaging quality.

15 Claims, 3 Drawing Sheets

PROJECTION OBJECTIVE FOR MICROLITHOGRAPHY

This is a National Stage Application of International Application PCT/EP2005/008392, with an international filing date of Aug. 3, 2005, which was published under PCT Article 21(2) in English, and which claims the benefit of U.S. Provisional Application No. 60/599,055, filed Aug. 6, 2004; the disclosures of the International and Provisional Applications are incorporated into this National Stage Application by reference.

BACKGROUND OF THE INVENTION

1. Field of the Invention

The invention relates to a projection objective for imaging a pattern of a mask arranged in an object surface of the projection objective into an image field arranged in the image surface of the projection objective with a demagnifying imaging scale, and to a microlithography projection exposure apparatus having such a projection objective.

2. Description of the Related Prior Art

Photolithographic projection objectives with a demagnifying imaging scale (reduction objectives) have been used for several decades for the photolithographic fabrication of semiconductor components and other finely patterned devices. They serve for projecting the pattern of a mask, e.g. of a photomask or of a reticle, onto an article coated with a light-sensitive layer with very high resolution on a demagnifying scale.

Conventional projection systems are designed to image a planar mask onto a planar image field. Accordingly, measures for correcting the image field curvature (Petzval correction) are provided in the projection objectives. The article "New lenses for microlithography" by E. Glatzel in: SPIE Vol. 237 (1980), pp. 310-320, describes known measures for leveling the image field.

The U.S. Pat. No. 5,052,763 describes a catadioptric projection objective with intermediate image, wherein the image of the object field (intermediate image) generated by a first, catadioptric subsystem is imaged into the image plane with the aid of a second, refractive subsystem. In order to be able to image a planar object into a planar image surface, the Petzval sum of the system is obtained by compensation of the image field curvature generated by the first subsystem by means of the second subsystem, a curved intermediate image surface being generated.

The U.S. Pat. No. 4,812,028 describes a microlithography projection objective having aplanatic refracting surfaces, non-aplanatic refracting surfaces and reflective surfaces. The Petzval sums of the aplanatic refracting surfaces and of the remaining surfaces are corrected independently of one another.

For projection lithography onto curved substrates, the U.S. Pat. No. 6,461,908 B1 proposes using a curved mask whose form is identical to the form of the curved substrate. The curved mask is produced in a contact method. Curvature-conforming imaging of the curved mask onto the curved substrate requires projection objectives with a substantial correction of the image field curvature.

The U.S. Pat. No. 5,527,139 discloses a purely reflective reduction objective for extreme ultraviolet radiation (EUV), wherein the object surface and/or the image surface are curved concavely with respect to the projection objective.

The patent application US 2003/0133087 A1 describes a method by which imaging errors that may result on account of the gravitational-force-dictated curvature of a reticle are intended to be prevented. This involves taking account of the fact that a gravitational-force-dictated mask bending can lead to a distortion of the pattern situated on the mask (pattern stretching), so that errors similar to a distortion error result in the image of the pattern. In order to correct these errors, an optical correction element designed for a distortion correction is introduced between the object plane and the projection objective.

SUMMARY OF THE INVENTION

It is an object of the invention to provide a projection objective by means of which adverse influences of the force of gravity on the imaging quality can be avoided.

This object is achieved, in accordance with a formulation of the invention, by means of a projection objective for imaging a pattern arranged in an object surface of the projection objective into an image surface of the projection objective with a demagnified imaging scale, the projection objective having a plurality of optical elements which are arranged along an optical axis of the projection objective and are configured in such a way that a defined finite image field curvature of the projection objective is set in such a way that an object surface that is curved convexly with respect to the projection objective can be imaged into a planar image surface.

The projection objective is thus distinguished by the fact that a predetermined, finite value is provided for the image field curvature in order intentionally to enable a non-curvature-conforming or curvature-altering imaging between the curved object surface and the optically conjugate, planar image surface or image plane with respect thereto.

As is known, the image field curvature dependent only on the radii of the refracting surfaces and the refractive indices of the optical components, with astigmatism eliminated and correction of the remaining aberrations, leads to the punctiform imaging of an object plane that is orthogonal with respect to the optical axis onto a curved image surface, the peak curvature of which is referred to as the Petzval curvature. The Petzval curvature is proportional to the Petzval sum $1/R_P$, the reciprocal of which is the Petzval radius $R_P$.

Conventional systems are set to a value of the Petzval sum as close as possible to 0, so that the Petzval radius $R_P$ should be infinite. The Petzval correction, i.e. the correction of the image field curvature, is typically performed such that the magnitude of the Petzval sum is small in relation to the depth of focus DOF, e.g. in accordance with $|R_P|<0.1$ DOF. As is known, the depth of focus is proportional to $\lambda/NA^2$, where $\lambda$ is the operating wavelength and NA is the image-side numerical aperture of the projection objective. Projection objectives according to the invention deviate substantially from this design goal with regard to the correction of the image field curvature, so that a bias of the image field curvature is created. In advantageous embodiments of projection objectives according to the invention, the following holds true: $|R_P|\geq 0.1$ DOF.

In this case, the projection objective has an object surface that is curved convexly with respect to the projection objective. Thus surface curvature is opposite to the "natural" surface curvature of a lens system with a positive refractive power overall and no or only weak Petzval correction and also a planar image surface. Accordingly, the measures provided for correction of the image field curvature are intensified in comparison with a similar system with a planar object surface and planar image plane in the sense of an overcorrection of the image shell.

A preferred embodiment with an object surface that is curved convexly with respect to the projection objective is optimized toward taking account of a gravitation-dictated bending of the mask by means of corresponding measures for influencing the image field curvature. The projection objective is provided for utilization with an optical axis that is oriented vertically in the region of the object surface, and the object surface is curved in such a way that an effective object surface curvature in at least one direction perpendicular to the optical axis essentially corresponds to a gravitation-dictated mask bending of the mask. As a result, the pattern of a mask that has bent on account of gravity influences between bearing surfaces can on average be imaged sharply into a planar image surface, it being possible to avoid typical errors attributed to image field curvature. In the case of such projection objectives, the gravitation-dictated portion in the error budget is obviated, as a result of which stabler processes are made possible.

This aspect of the invention is based on the consideration that, for a given construction of a mask holder (reticle stage) and a predetermined mask construction (with regard to size, thickness, material, etc.), a "fingerprint" of the gravitation-dictated bending of the mask exists which is characteristic of these conditions and which is always present in the same way as a systematic contribution and is translated into a bending of the image surface with the square of the imaging scale in the case of a Petzval-corrected system. The resultant contributions to the image field curvature in the region of the substrate to be exposed may perfectly well be of the order of magnitude of 10 to 50 nm, in particular of 20-30 nm, in present-day systems. These contributions may be tolerable as long as they are small relative to the depth of field or depth of focus (DOF) of the projection objective. However, the latter decreases drastically as the image-side numerical aperture NA increases and the wavelength $\lambda$ decreases, to be precise linearly with $\lambda$ and with the square of the numerical aperture. Therefore, the image errors resulting from a gravitation-dictated mask bending may be disturbing, particularly in systems having high numerical apertures, for example NA>0.8 or >0.85. These problems are avoided in the embodiments mentioned The gravitation-dictated bending of the mask is cylindrical to a first approximation in many mask holding systems and cannot be completely biased in a rotationally symmetrical objective design. The situation is different, however, in the case of projection objectives for wafer scanners, in which the mask is moved relative to the projection objective in a scanning direction perpendicular to the optical axis during the exposure operation (with synchronous movement of the substrate to be exposed). On account of the scanning operation, a rotationally symmetrically curved object surface of the projection objective is translated into an effectively cylindrically curved object surface of the scanner system since only a certain excerpt from the object surface is utilized for the imaging. A projection objective designed for a curved object surface which is curved in such a way that a scanner-integrated object surface curvature corresponds to the surface curvature produced by gravitation-dictated reticle bending can sharply image a bent mask into a planar image surface over the entire image field.

In the case of projection objectives in scanner systems, this means that a cylindrical mask bending can be taken into account well through suitable correction of the image field curvature near the projection objective. In the case of projection objectives for stepper systems, in particular, in which the mask and the article to be exposed are stationary during the exposure, it may be advantageous if at least one optical element of the projection objective bears at least one nonrotationally symmetrical surface, for example a toric surface.

The projection objective may be corrected with regard to all field-dependent image errors (e.g. distortion), with the exception of the image field curvature. Preferably, it is also corrected well with regard to field-independent image errors, such as spherical aberration, so that essentially only the image field curvature remains as uncorrected image error.

In the design of the projection objective, it must be taken into consideration that the image shell error that leads to an image field curvature or to a non-curvature-conforming imaging produces a variation of the image position over the image field. In contrast thereto, distortion is a variation of the image size. Therefore, the two errors can be fundamentally distinguished from one another. The image shell, represented e.g. by the Petzval curvature, is influenced by the sum of all surface refractive powers, to be precise first and foremost by means of the radii of the refracting surfaces and secondly by the refractive indices. At least the lowest-order image field curvature cannot be corrected by aspheres. The distortion, by contrast, can be influenced by deflecting the main imaging beam in the tangential direction. The distortion can be corrected at locations with large principal vay heights by means of suitable radii and thicknesses of lenses, but also by means of aspheres. In contrast to the correction of the image shell, the distortion cannot be influenced in the vicinity of the aperture diaphragm.

In order to produce a projection objective according to the invention, the following procedure is preferably adopted. Firstly, the projection objective is calculated in a conventional manner such that it is suitable for imaging a planar object surface into a planar image surface that is optically conjugate with respect thereto, with a corresponding imaging scale. A lens is then picked out in the case of which the surface radius is altered at one of the lens surfaces so as to result in the desired change in the Petzval sum or the image field curvature. The system is subsequently tuned, for example by adapting air clearances between the individual lenses in order to minimize alternations brought about by this modification in the case of other aberrations. In the case of new construction of projection objectives, such a lens which leads to a desired overcorrection of the image shell may be provided from the outset. If existing systems are intended to be optimized in accordance with the invention, then it is possible to exchange a lens provided at a suitable location for a lens with a changed surface radius and then to carry out the corresponding tuning.

Well-correctable projection objectives are possible in the context of the invention. There are embodiments which are designed as "dry objectives". Dry objectives are distinguished by the fact that they are designed for a gas-filled gap to be present during operation between the exit side of the projection objective and the coupling-in surface of an article to be exposed, for example a wafer, the gap width of said gap typically being significantly greater than the operating wavelength. In the case of such systems, the numerical apertures that can be achieved are restricted to values of NA<1, since, when approaching the value NA=1, total reflection conditions occur at the exit surface and prevent illumination light from being coupled out from the exit surface. In preferred embodiments of dry systems, the image-side numerical aperture is NA>0.8, NA$\geq$0.85 or NA$\geq$0.9 also being possible.

Projection objectives designed as immersion objectives are also possible in the context of the invention. In the case of immersion lithography, as is known, the resolution that can be achieved in an exposure process is improved by introducing an immersion medium having a high refractive index, for example an immersion liquid having a refractive index $n_f \geq 1.3$ at the operating wavelength, into the space between the last optical element of the projection objective and the substrate. Projection objectives or imagings having an image-side numerical aperture NA>1.0 are possible as a result, preferably NA≧1.1 or NA≧1.2 or NA≧1.3 being possible.

The optical construction also permits a use for contactless near field projection lithography. In this case, it is possible for sufficient light energy to be coupled into the substrate to be exposed via a gas-filled gap if a sufficiently small image-side operating distance is complied with on average over time. Said operating distance should be less than four times the operating wavelength used, in particular less than the operating wavelength. It is particularly favorable for the operating distance to be less than half of the operating wavelength, for example less than a third, a quarter or a fifth of the operating wavelength. Given these short operating distances, an imaging in the optical near field may be effected in the case of which evanescent fields that exist in direct proximity to the last optical surface of the imaging system are utilized for imaging.

The invention can be used in purely refractive projection objectives as well as in catadioptric projection objectives.

The above and further features emerge not only from the claims but also from the description and the drawings, in which case the individual features may be realized in each case on their own or as a plurality in the form of subcombinations in an embodiment of the invention and in other fields and may represent advantageous and intrinsically protectable embodiments.

DETAILED DESCRIPTION OF PREFERRED EMBODIMENTS

Figure 1:
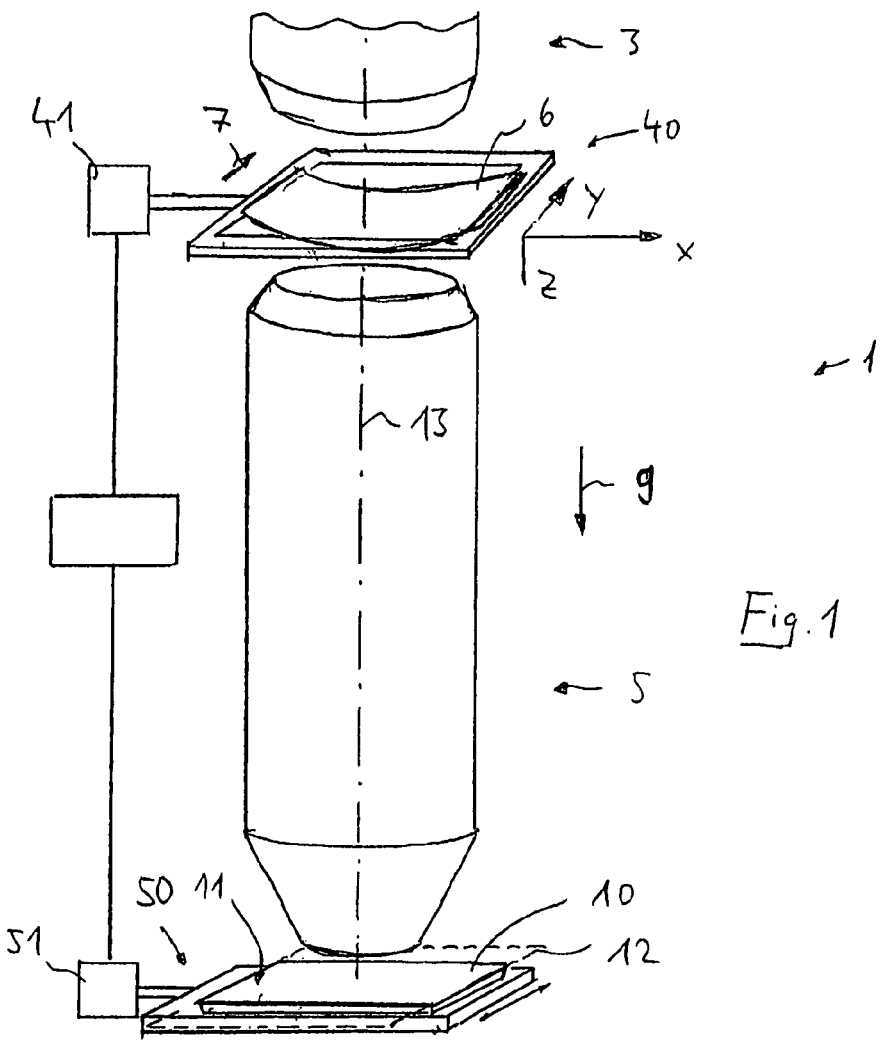
FIG. 1 schematically shows, in an oblique perspective illustration, an excerpt from a microlithography projection exposure apparatus with an embodiment of a projection objective according to the invention.

FIG. 1 schematically shows the essential component parts of a microlithography projection exposure apparatus in the form of a wafer scanner 1 provided for the production of large-scale integrated semiconductor components by means of projection lithography. The projection exposure apparatus 1 comprises, as light source, an excimer laser (not shown) having an operating wavelength of 193 nm, other operating wavelengths, for example 157 nm or 248 nm, also being possible. A downstream illumination system 3, of which only the light exit region is shown, generates in its exit surface 4 a large, sharply delimited illumination field that is illuminated very homogeneously and is adapted to the telecentric requirements of the downstream projection objective 5. The illumination system 3 has devices for selection of the illumination mode and, in the example, can be changed over between conventional illumination with a variable degree of coherence, annular field illumination and dipole or quadrupole illumination.

In the direction of light propagation downstream of the illumination system there is arranged a device 40 (reticle stage) for holding and manipulating a mask (reticle) 6 such that the latter lies in the object surface 4 of the projection objective 5 and can be moved in a traveling direction (scanning direction) 7 (y direction) with the aid of a scanner drive 41 for scanning operation.

Figure 2:
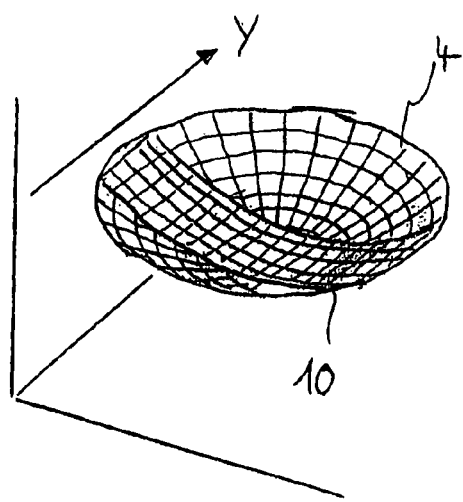
FIG. 2 shows a schematic illustration of the rotationally symmetrical, curved object surface of the projection objective in FIG. 1 with a scanner slot.

Downstream of the object surface 4, the curved form of which will be explained in more detail with reference to FIG. 2, there follows at a suitable distance (object-side operating distance) the reduction objective 5, which images an image of the mask, with a reduced scale of 4:1, onto a wafer 10 coated with a photoresist layer. Other reduction scales, e.g. 5:1 or 10:1 or less, are likewise possible. The wafer 10 serving as a light-sensitive substrate is arranged such that its planar substrate surface 11 with the photo-resist layer essentially coincides with the planar image plane 12 (depicted in dashed fashion) of the projection objective 5. The wafer is held by a device 50 (wafer stage) comprising a scanner drive 51 in order to move the wafer synchronously with the mask 6 parallel to the latter.

The projection objective 5 is incorporated into the wafer scanner such that its optical axis 13 is oriented vertically and thus parallel to the effective direction g of the force of gravity. The mask mount 40 is designed such that, apart from the force of gravity, no imposed forces which might lead to a deformation of the mask 6 occur at the reticle 6 placed on said mount. Outside the region through which the illumination radiation is to radiate, the transmission mask 6 is mounted on suitable bearing surfaces (or support surfaces) which are at a constructionally predetermined bearing distance from one another (cf. FIG. 5). Between the bearing surfaces, the reticle 6 is freely suspended and is exposed to the force of gravity g, which causes a gravitation-dictated mask bending. Depending on the type of reticle and the bearing geometry, a gravitation-dictated bending is established in this case which is always present in essentially the same way as a systematic contribution and, in the case of conventional Petzval-corrected systems, would be converted into a bending of the image of the mask with the square of the imaging ratio. Given a standard size of currently used quartz glass reticles of 6 inches·6 inches given a typical thickness of 6.35 mm, typical instances of gravitation-dictated bending may be in the range of between 300 and 400 nm depending on the bearing geometry. In the case of typical conventional systems that are optimized for imaging a planar object surface into a planar image surface, this reticle bending, given an imaging scale of 4:1, would lead to an image field curvature of the order of magnitude of between 20 and 25 nm. This indication of the image field curvature relates to the maximum excursion s' of the image field IF in the image field center (at the optical axis OA) in comparison with the axial position of the image field at the edge of the image field, or to a deviation s'—measured in the axially parallel direction—of the curved image field from a plane IM lying perpendicular to the optical axis at the image field edge (cf. FIG. 6). This image field curvature becomes more critical the smaller the available depth of focus DOF of the projection system. Although it is possible to obtain a good compromise between sagittal and tangential image shell with the aid of manipulators by shifting lenses or displacing them in some other way, this is always accompanied by induced astigmatism on account of the Petzval condition.

These problems are avoided in the case of the embodiment of the projection objective 5 shown. The projection objective 5 is designed for imaging an object surface 4 that is curved convexly with respect to the projection objective (FIG. 2) into a planar image plane 12. Thus, in contrast to conventional systems, the mutually optically conjugate surfaces do not have the same curvature state or a corresponding curvature state transformed by way of the imaging scale, rather a curvature-altering imaging process is provided. In this case, the projection objective 5 is designed such that all image errors, with the exception of the image field curvature, are completely corrected within narrow tolerances. By contrast, the image field curvature is altered by the projection objective 5 such that a reticle 6 bent with respect to the projection objective can be sharply imaged onto a planar wafer over the entire image surface.

Figure 3:
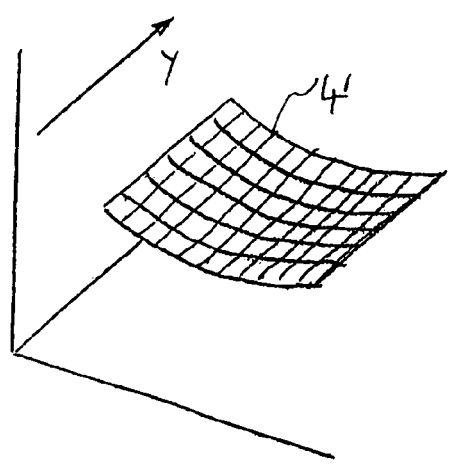
FIG. 3 shows a schematic illustration of the form of the effective object surface of the projection objective which is produced as a result of scanning movement.

The gravitation-dictated bending of the reticle is cylindrical to a first approximation. A complete bias for compensation of this warpage is not possible in a rotationally symmetrical objective design. It can be approximated, however. The situation is different in the case of a scanner objective, that is to say a projection objective provided for use in a wafer scanner. On account of the scanning operation running in the y direction, a rotationally symmetrically curved object surface 4 (FIG. 2) of the projection objective is translated into an effectively cylindrical object surface 4' of the scanner system (FIG. 3). This effect results from the fact that only the slotted excerpt 10 which is depicted centrally in FIG. 2 and corresponds to the illuminated scanner slot is used for imaging. A movement of the approximately cylindrically curved region of the scanner slot in the y direction produces the cylindrically curved effective object surface 4' in FIG. 3. The curvature thereof is adapted, by the means for influencing the image field curvature that are provided within the projection objective 5, to the reticle geometry of the bent reticle such that the mask structure to be imaged essentially coincides with the effective cylindrically curved object surface 4, which is optically conjugate with respect to the image plane 12. The mask 6 bent in the direction of the projection objective can thereby be sharply imaged onto the planar wafer 10 over the entire image field diameter. A projection objective designed for an object surface which is curved convexly with respect to the projection objective and which is curved in such a way that the scanner-integrated object surface curvature corresponds to the gravitation-dictated reticle bending will accordingly on average sharply image a bent reticle into a planar image shell. As a result, the gravitation-dictated portion in the focus budget is obviated and a stabler exposure process is possible.

Taking account of the reticle bending in the design of the projection objective can also be applied, in principle, to stepper systems. In this case, it is advantageous to generate the intervention in the image field curvature with the aid of non-rotationally symmetrical, for example, toric, surfaces which may be applied on one or more lenses. Suitable aspheric forms are dependent on the bearing geometry of the reticle in this case.

Figure 4:
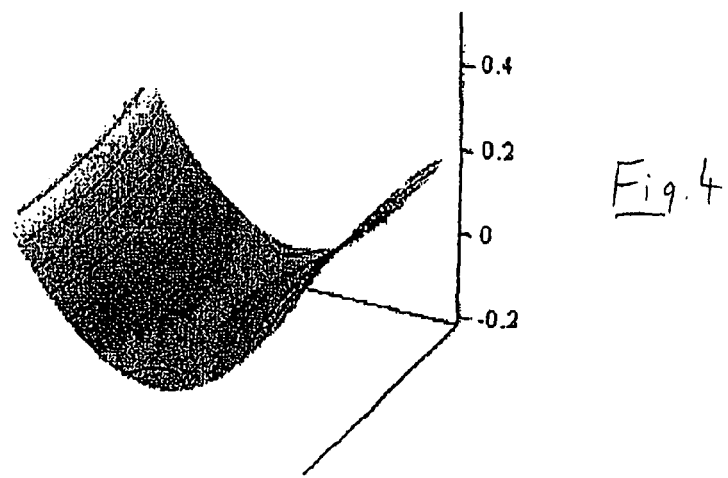
FIG. 4 shows a measured bending of a standard reticle in a schematic illustration.
Figure 5:
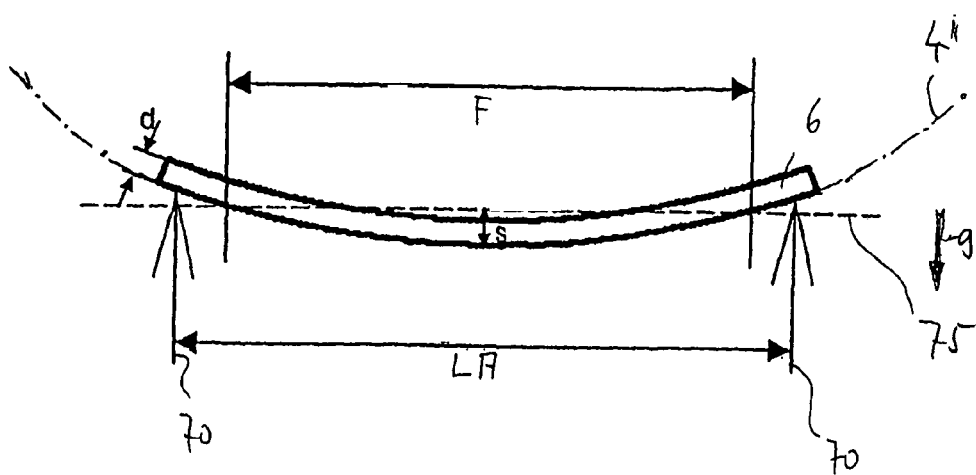
FIG. 5 shows a schematic illustration of a bent reticle for calculating the theoretically expected mask bending.

In order to explain the required order of magnitude of the image shell overcorrection of the projection objective 5, FIG. 4 firstly shows, in a perspective illustration, the measured, essentially cylindrically curved profile of the surface of a standard reticle (reticle size 6·6 inches, thickness 6.35 mm, material: quartz glass) bent in a gravitation-dictated manner. FIG. 5 illustrates the conditions required for deriving the suitable object surface curvature. The reticle 6 bears on two bearing surfaces 70 which are at a lateral bearing distance LA from one another. The bearing distance is greater than the object field diameter F, in order that the imaging is not disturbed by the bearings. The reticle has a thickness d and is composed of a mask material having density ρ and modulus of elasticity E. Under the action of the force of gravity g, a reticle bending s is established which, in this illustration, is defined as the maximum excursion of the reticle in the g direction with regard to the reference plane 75 which is illustrated in dashed fashion and is defined by the bearing surfaces. A circle arc 4" which is defined by the bent reticle surface and represents the optimum profile of the curved object surface for this bent reticle corresponds to said bending s. The radius of the circle arc 4" corresponds to the object surface radius of curvature OFCR of the object surface in this direction running perpendicular to the optical axis.

Given this schematic geometry of the reticle mount, the theoretically expected bending of the reticle results in accordance with:

$$s = \frac{\rho g}{4E} \cdot \frac{LA^4}{d^2} \cdot \frac{F^2}{LA^2}$$

Figure 6:
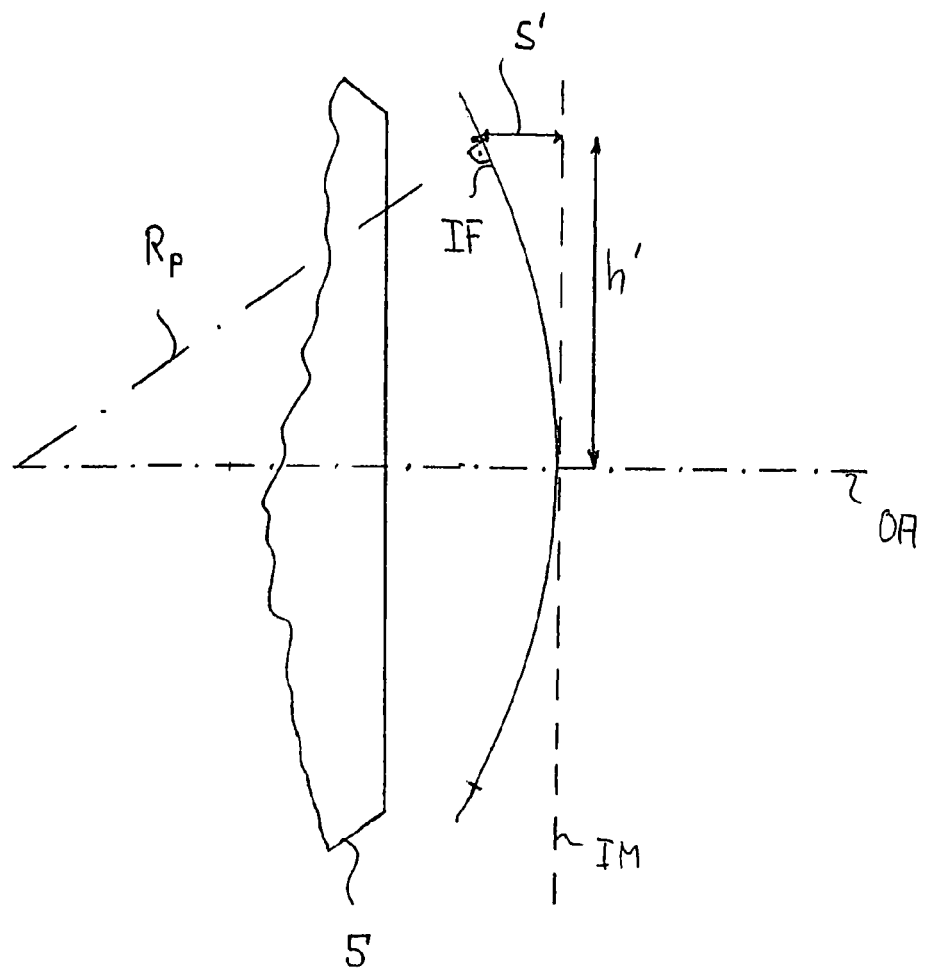
FIG. 6 shows a schematic illustration for quantifying the image field curvature.

An explanation will now be given in connection with FIG. 6 with regard to the image field curvature to which said bending leads on the image side of the projection objective and what extent of the Petzval correction is necessary for compensation of this effect. In this respect, FIG. 6 shows the image-side end of the projection objective, together with the region of the image field IF. The object-side reticle bending s is translated into an image-side image field curvature s' with the square of the imaging scale β in accordance with $s'=\beta^2 \cdot s$. In this case, the image field curvature is parameterized by a deviation s'—measured in the axially parallel direction—of the curved image field IF from a plane IM lying perpendicular to the optical axis OA at the edge of the image field IF. The edge of the image field is at a distance h' (image-side image height) from the optical axis OA. In the sectional plane shown in FIG. 6, the image field IF is curved spherically to a good approximation, so that it lies on a circle arc having a radius $R_P$. This is the Petzval radius, for which the following holds true in accordance with the circle equation for long radii to a good approximation: $R_P = h'^2/(2 \cdot s')$. The Petzval sum $1/R_P$ of a system which can image a mask having bending s into a planar image plane thus results from the following equation:

$$1/R_P = \frac{2 \cdot \beta^2 \cdot s}{h'^2}.$$

This estimation permits a corresponding bias of the image field curvature to be provided in a projection objective in order to take account of the effects of a gravitation-dictated reticle bending on the imaging quality.

A projection objective can be adapted by means of a fixedly predetermined bias to the expected bending of typical reticles. It is also possible to perform a dynamic adaptation by providing suitable manipulators within the projection system in order, upon transition to other types of reticles, by way of example, to be able to perform a changed adaptation without reconstructing the projection objective. Suitable manipulators are, in particular, devices which bring about radii changes and/or refractive index changes within the projection objective. Refractive index changes may be brought about for example by means of pressure changes and/or temperature changes in the gas in lens interspaces. Radii changes may be introduced by active optical components, e.g. by active mirrors. Heating or cooling a lens may lead to a change in refractive index and dimensioning of the lens and therefore be utilized as a manipulator.

The invention claimed is:

1. A projection objective configured to image a pattern arranged in an object surface of the projection objective into an image surface of the projection objective with a demagnified imaging scale, comprising:
a plurality of optical elements arranged along an optical axis of the projection objective and configured with a defined image field curvature to image an object surface into a planar image surface, the plurality of optical elements comprising:
at least one of: (i) at least one optical surface configured to overcorrect the defined image field curvature such that an object surface that is curved with respect to the projection objective is imaged into the planar image surface, and (ii) at least one optical surface configured to be altered by a manipulator, to thereby overcorrect the defined image field curvature such that the object surface that is curved with respect to the projection objective is imaged into the planar image surface.

2. The projection objective as claimed in claim 1, wherein the curved object surface is curved such that an effective curvature of the curved object surface in at least one direction perpendicular to the optical axis corresponds at least essentially to a surface curvature which results from a gravitation-dictated mask bending of the mask.

3. The projection objective as claimed in claim 2, wherein the effective curvature of the curved object surface corresponds to a gravitation-dictated bending of the mask which is substantially cylindrical.

4. The projection objective as claimed in claim 1, wherein the projection objective is designed for use with a mask that is moved in a scanning direction, and the object surface is curved such that a curvature of the object surface which is scanner-integrated in the scanning direction corresponds to the curvature of the object surface caused by gravitation-dictated bending of the mask.

5. The projection objective as claimed in claim 1, wherein the at least one optical surface of the projection objective is nonrotationally symmetrical.

6. The projection objective as claimed in claim 5, wherein the nonrotationally symmetrical surface is a toric surface designed for influencing the image field curvature.

7. The projection objective as claimed in claim 1, wherein the projection objective is corrected at least essentially with regard to all field-dependent image errors other than the image field curvature.

8. The projection objective as claimed in claim 1, wherein the projection objective is corrected at least essentially with regard to all image errors other than the image field curvature.

9. The projection objective as claimed in claim 1, wherein the projection objective has an image-side numerical aperture NA>0.8.

10. The projection objective as claimed in claim 1, wherein $|R_p| \geq 0.1$ DOF, where $|R_p|$ is the magnitude of the Petzval sum and DOF is the depth of focus of the projection objective.

11. A projection objective configured to image a pattern arranged in an object surface of the projection objective into an image surface of the projection objective with a demagnified imaging scale, comprising:
a plurality of optical elements arranged along an optical axis of the projection objective and configured with a defined image field curvature to image an object surface that is curved convexly with respect to the projection objective into a planar image surface,
wherein the object surface is curved such that an effective object surface curvature in at least one direction perpendicular to the optical axis corresponds at least essentially to a surface curvature which results from a gravitation-dictated mask bending of the mask, and wherein $|R_p| \geq 0.1$ DOF, where $|R_p|$ is the magnitude of the Petzval sum and DOF is the depth of focus of the projection objective.

12. The projection objective as claimed in claim 11, wherein the effective object surface curvature corresponds to a gravitation-dictated bending of the mask which is substantially cylindrical.

13. A projection objective configured to image a pattern arranged in an object surface of the projection objective into an image surface of the projection objective with a demagnified imaging scale and a defined image field curvature, comprising:
a plurality of optical elements arranged along an optical axis of the projection objective and including at least one element for overcorrecting the image field curvature, to image an object surface that is curved convexly with respect to the projection objective into a planar image surface.

14. The projection objective according to claim 13, wherein the plurality of optical elements includes exactly one element for producing a bias of the image field curvature, such that the optical elements without the bias image a planar object surface into the planar image surface.

15. The projection objective according to claim 13, wherein the at least one element alters at least one radius or at least one refractive index of at least one of the plurality of optical elements.

* * * * *

UNITED STATES PATENT AND TRADEMARK OFFICE
CERTIFICATE OF CORRECTION

PATENT NO. : 8,212,988 B2
APPLICATION NO. : 11/658574
DATED : July 3, 2012
INVENTOR(S) : Bernd Geh It is certified that error appears in the above-identified patent and that said Letters Patent is hereby corrected as shown below:

Title Page, Col. 1, Item 73: delete "Carl Zeiss GmbH," and insert -- Carl Zeiss SMT GmbH, --

Column 3, Line 41: delete "mentioned" and insert -- mentioned. --

Column 10, Line 5: in Claim 10, delete "$|R_p|$" and insert -- $|R_P|$ --

Column 10, Line 20: in Claim 11, delete "24" and insert -- $\geq$ --

Column 10, Line 21: in Claim 11, delete "$|R_p|$" and insert -- $|R_P|$ --

Signed and Sealed this
Ninth Day of October, 2012

David J. Kappos
*Director of the United States Patent and Trademark Office*